United States Patent

Lorenzini et al.

[11] 4,036,595
[45] July 19, 1977

[54] CONTINUOUS CRYSTAL GROWING FURNACE

[75] Inventors: Robert E. Lorenzini, Menlo Park; Akiyoshi Iwata, Sunnyvale; Karl Lorenz, Redwood City, all of Calif.

[73] Assignee: Siltec Corporation, Menlo Park, Calif.

[21] Appl. No.: 629,609

[22] Filed: Nov. 6, 1975

[51] Int. Cl.² ............................................. B01J 17/18
[52] U.S. Cl. ............................. 23/273 SP; 156/601; 156/617 SP
[58] Field of Search ................. 23/273 SP; 156/608, 156/617 SP, 601

[56] References Cited

U.S. PATENT DOCUMENTS

| | | | |
|---|---|---|---|
| 2,892,739 | 6/1959 | Rusler | 156/608 X |
| 3,206,286 | 9/1965 | Bennett, Jr. et al. | 23/273 SP |
| 3,305,485 | 2/1967 | Burmeister et al. | 156/617 SP X |
| 3,507,625 | 4/1970 | Deyris | 156/617 SP |
| 3,882,319 | 5/1975 | Clement et al. | 156/601 |

FOREIGN PATENT DOCUMENTS 939,102  10/1963  United Kingdom ................. 156/608

*Primary Examiner*—Wilbur L. Bascomb, Jr.
*Assistant Examiner*—Barry I. Hollander
*Attorney, Agent, or Firm*—Robert G. Slick

[57] ABSTRACT

A crystal growing furnace is provided wherein the molten material in the crucible is replaced constantly as it is withdrawn by a monitoring system which automatically maintains the level in the crucible at a desired point. A replaceable cannister system is also provided so that the level can be maintained indefinitely by replacing the cannisters.

4 Claims, 1 Drawing Figure

U.S. Patent     July 19, 1977     4,036,595
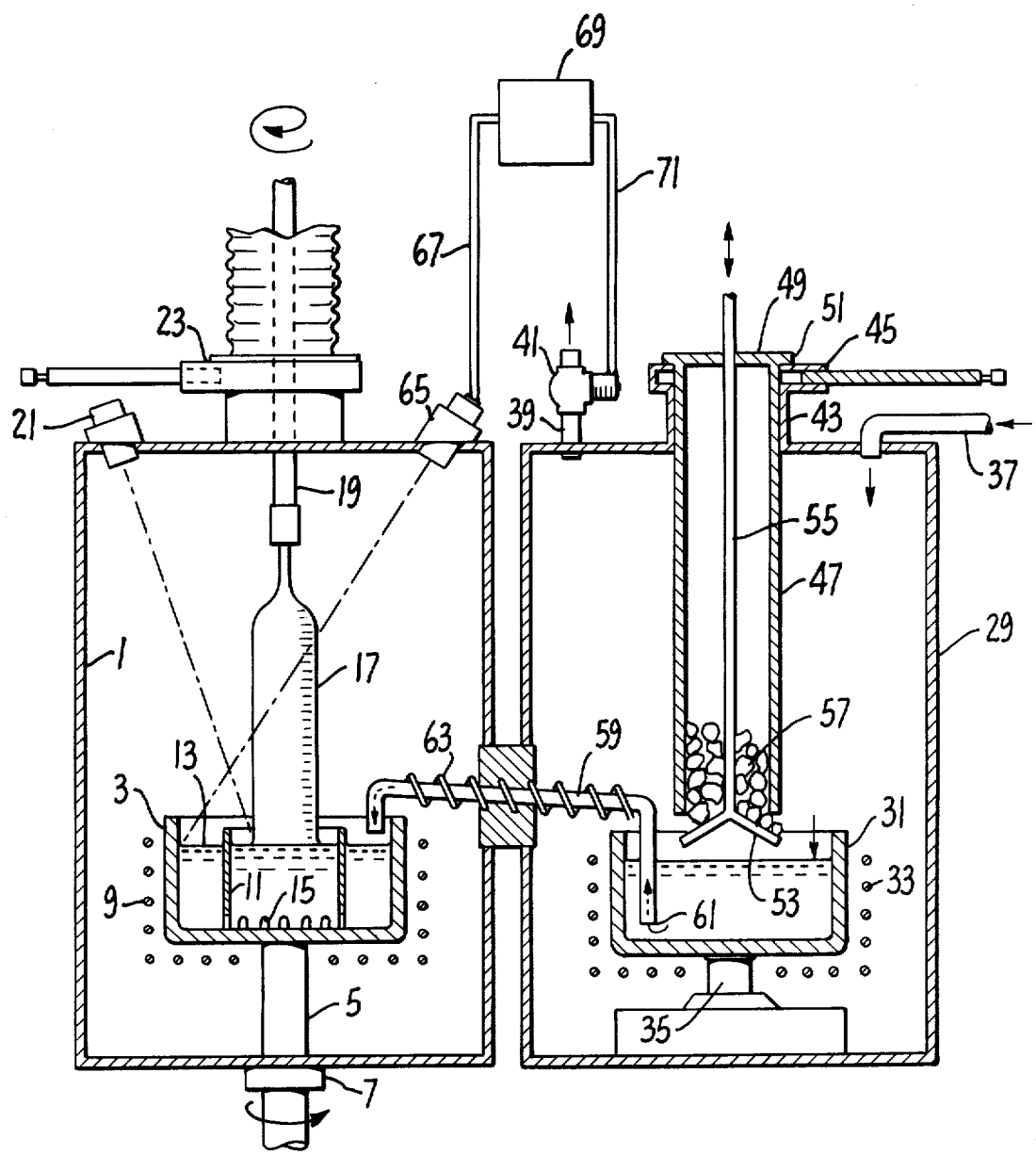

CONTINUOUS CRYSTAL GROWING FURNACE

SUMMARY OF THE INVENTION

In the growing of semiconductor crystals such as silicon and germanium, a crystal growing furnace is ordinarily employed wherein a melt of the material is maintained while a seed crystal is slowly withdrawn from the melt to provide a crystal of substantial length.

In the past, it has been the practice to fill the crucible with the material from which the crystal is to be grown and to then draw a single large crystal from the melt. This depletes approximately 90% of the molten material and it is then necessary to shut the furnace down, remove the crystal, and provide a new crucible containing a new charge of material in the furnace. This involves a substantial down time.

In accordance with the present invention, a continuous crystal growing furnace is provided wherein the charge can be maintained in the crucible for an indefinite length of time so that a number of crystals can be grown without the necessity of shutting the furnace down with the attendant loss of raw material, labor and down time for the furnace.

One of the main features of the present invention is that an automatic sensor and feedback system is employed so that the level within the crystal growing furnace is automatically maintained for long periods of time without attention on the part of the operator.

Another advantage of the present invention is that the material can be fed to a pre-melting chamber, in the form of replaceable cannisters so that the cannisters can be preloaded and one after another employed to recharge the furnace, all without stopping the operation and without danger of contamination.

A still further advantage of the present invention is that the molten material for recharging the furnace is not drawn from the surface or the bottom of a melt but instead is drawn at a point well under the surface but above the bottom, permitting one to employ raw materials having a high surface to volume feed material. In the past, if one employed such a material such as very small chunks, broken wafers, needles and the like, slag and silicon monoxide might form which would be detrimental to the crystal. By drawing the materials from an intermediate level of an auxiliary chamber, slag, silicon monoxide or other impurities will not be introduced into the crystal growing furance regardless of whether such impurities float or sink in the preliminary melt.

The closest known prior art is U.S. Pat. No. 3,507,625 which shows introducing a molten liquid into a crystal growing furance. The apparatus of the present invention differs from said patent in that (a) automatic level control is provided, (b) a replaceable cannister system is provided, and (c) there is no possibility of drawing slag or other impurities into the crystal growing furnace.

Other features and advantages of the present invention will be brought out in the balance of the specification.

BRIEF DESCRIPTION OF THE DRAWINGS

The sole FIGURE of the drawing is a sectional view of an apparatus embodying the present invention.

DESCRIPTION OF THE PREFERRED EMBODIMENTS

The growing of semiconductor crystals in a furance is a well-known art and that portion of the apparatus which is known will be described only briefly.

The crystal growing furnace includes a suitable enclosure 1 for containing the melt and the crystal being grown and is ordinarily provided with a controlled atmosphere, by means not illustrated. The crucible itself is designated 3 and is of an inert material such as quartz. Crucible 3 is mounted on a shaft 5 which passes through a seal 7. Shaft 5 is rotated in a uniform manner by a means not illustrated. The heating element 9, suitably RF or resistance heating, surrounds crucible 3. Mounted within the crucible is a quartz baffle 11 which extends above the surface of the melt 13 in the crucible and which has a series of holes 15 in the bottom so that liquid can migrate from the outer portion of the crucible into the central portion from which the crystal is drawn.

The crystal 17 is drawn from the liquid in the crucible by a rod 19 which has suitable means for rotating and pulling the rod, not shown. The rotation and pulling rate may be controlled from a sensor 21 which senses the interface between solid and liquid semiconductor material. A slide valve 23 is provided at the top of the furnace so that the crystal can be withdrawn when it has grown to a desired size and replaced with a fresh rod containing a seed crystal for a repetition of the process.

Adjacent chamber 1 is a chamber 29 of similar structure which has a fixed crucible 31 therein surrounded by a heating element 33. Crucible 31 is supported on a pillar 35 and it is not necessary to provide any means for rotating the crucible. Chamber 29 is provided with an inlet 37 for an inert gas such as argon from a source not shown. The chamber also has an outlet 39 for venting gas and a solenoid valve 41 determines the amount of venting as is later explained in detail.

At the top of the chamber 29 is a cylindrical opening 43 having a valve mechanism 45 whereby the chamber can be closed. A cannister 47 is provided which is cylindrical and which forms a tight fit in the opening 43. Cannister 47 has a closed top 49 with a flange 51 which rests on top of the valve 45. The bottom of cannister 47 is closed by a bottom member 53 which is attached to rod 55. Cannister 47 is adapted to receive a quantity of semiconductor material such as is shown at 57. By lowering the rod 55 one can release a desired amount of the semiconductor material 57 into the crucible 31.

A tube 59 extends from a point 61 intermediate the bottom and top surface of the liquid in crucible 31 to the top surface of the crucible 3 outside of the baffle 11. Tube 59 is preferably provided with a suitable heating coil 63 to maintain the liquid temperature of the liquid semiconductor material therein. This prevents freezing up during those periods when no actual liquid transfer is taking place and also avoids introducing cool material into crucible 3.

Sensor 65, preferably an optical thermopile, senses the level of the liquid in the crucible 3 and is connected by wires 67 to a control box 69. Control box 69 is also connected by wires 71 to the solenoid valve 41 as previously described. The action is such that as the level in crucible 3 drops, this is sensed by 65 and the control box 69 causes valve 41 to become at least partially closed, building up pressure in the chamber 29 and forcing liquid from crucible 31 to crucible 3. When a desired level is reached, the pressure between chambers 29 and 1 is equalized and liquid flow ceases.

The crystal 17 is pulled from the space within the baffle 11 while fresh material introduced into the crucible 3 outside the baffle 11. Thus, even should some light material, such as slag, get through the tube 59, it would float on the surface of the semiconductor material outside of the baffle and not contaminate the crystal. If some heavy material is introduced into the crucible 31, it would remain on the bottom of the crucible since the intake is substantially above the bottom.

It is apparent from the above, that by employing the apparatus of the present invention, the crystal growing operation can be substantially continuous. One may provide a plurality of the cannisters 47 which are loaded and stored in an appropriate place. When one of the cannisters is exhausted, it can be merely lifted out of the chamber 29 and the valve 45 closed and a fresh cannister procured. The valve is opened and the new cannister inserted. Thus a continuous supply of semiconductor material can be provided in the crucible 31.

In a like manner, as a crystal 17 attains a desired size, it can be withdrawn by pulling up on rod 19 and the valve 23 closed. A fresh rod having a seed crystal thereon is then introduced through valve 23 for a repetition of the operation. Thus, it is not necessary to interrupt the operation or cool down the furnaces either for the replenishment of the raw material in chamber 29 or to start growing a new crystal in the chamber 1.

Although a specific embodiment of the invention has been described, it will be apparent that many variations can be made in the exact structure shown without departing from the spirit of this invention.

We claim:

1. In an apparatus for growing a semiconductor crystal from a melt of a semiconductor material maintained in a first crucible, said first crucible being enclosed in a first chamber, the improvement comprising a second crucible having means for melting solid material to provide a melt in said second crucible and means for introducing said molten material from said second crucible to said first crucible, said means including a tube extending into the molten material of the second crucible whereby liquid is withdrawn from the second crucible from a point between the bottom of the crucible and the top surface of the melt, said second crucible being mounted in an enclosed second chamber separate from said first chamber, said second chamber having a top opening leading to said second chamber, said top opening having valve means to selectively close or open said top opening, and a tight fitting cannister adapted to be inserted into said top opening, said cannister being elongated and having a valve means at the bottom thereof and operating means connected to said bottom valve means and extending out through the top of the cannister whereby the contents of the cannister can be selectively introduced by actuating said operating means.

2. The apparatus of claim 1 wherein a sensor is provided to determine the level of molten material in said first crucible and control means is provided in said second chamber whereby the amount of material introduced from said second crucible to said first crucible is automatically controlled to maintain the level in the first crucible at a desired level.

3. The apparatus of claim 2 wherein said second chamber is provided with an inlet for a pressurized inert gas and said second chamber has an outlet for said gas, and said sensor controls said outlet whereby the pressure within said second chamber is varied to control the amount of material forced from said second crucible to said first crucible.

4. The structure of claim 1 wherein a baffle is provided within said first crucible, said baffle defining a center space from which a crystal is drawn, and an outer space into which molten material is introduced, said baffle extending above the surface of liquid of the melt and having a plurality of holes adjacent to the bottom thereof, whereby liquid can migrate from said outer space to said center space.

* * * * *